(12) United States Patent
Kim et al.

(10) Patent No.: US 9,939,952 B2
(45) Date of Patent: Apr. 10, 2018

(54) ORGANIC LIGHT EMITTING DISPLAY DEVICE

(71) Applicant: LG Display Co., Ltd., Seoul (KR)

(72) Inventors: EungKyu Kim, Gyeonggi-do (KR); SinKyun Park, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/193,515

(22) Filed: Jun. 27, 2016

(65) Prior Publication Data

US 2017/0003806 A1    Jan. 5, 2017

(30) Foreign Application Priority Data

Jun. 30, 2015 (KR) ........................ 10-2015-0093378

(51) Int. Cl.
| | | |
|---|---|---|
| *G06F 3/041* | (2006.01) | |
| *H01L 27/32* | (2006.01) | |
| *H01L 51/52* | (2006.01) | |
| *G06F 3/044* | (2006.01) | |
| *G09G 3/3233* | (2016.01) | |
| *G06F 11/00* | (2006.01) | |
| *G09G 3/3225* | (2016.01) | |

(52) U.S. Cl.
CPC ............ *G06F 3/0416* (2013.01); *G06F 3/044* (2013.01); *G06F 11/00* (2013.01); *G09G 3/3225* (2013.01); *G09G 3/3233* (2013.01); *H01L 27/323* (2013.01); *H01L 51/5281* (2013.01); *G09G 2320/041* (2013.01); *G09G 2330/04* (2013.01); *G09G 2330/045* (2013.01)

(58) Field of Classification Search
CPC ... G06F 3/041–3/047; G06F 3/0488–3/04897; G09G 2330/00; G09G 2330/04; G09G 2330/045
See application file for complete search history.

(56) References Cited

U.S. PATENT DOCUMENTS

| | | | | |
|---|---|---|---|---|
| 9,276,191 | B2 * | 3/2016 | Ando | G06F 3/0433 |
| 2005/0057580 | A1 * | 3/2005 | Yamano | G09G 3/3241 345/690 |
| 2012/0026123 | A1 * | 2/2012 | Grunthaner | G06F 3/0418 345/174 |
| 2013/0108061 | A1 * | 5/2013 | Ando | G06F 3/0433 381/55 |
| 2013/0147752 | A1 * | 6/2013 | Simmons | G06F 3/044 345/174 |
| 2014/0169399 | A1 * | 6/2014 | Bayramoglu | G06F 3/041 374/45 |
| 2015/0095816 | A1 * | 4/2015 | Pan | G06F 3/0481 715/765 |
| 2016/0357285 | A1 * | 12/2016 | Ono | G06F 3/044 |

* cited by examiner

*Primary Examiner* — Gene W Lee
(74) *Attorney, Agent, or Firm* — Morgan, Lewis & Bockius, LLP

(57) ABSTRACT

An organic light emitting display device is provided. The organic light emitting display device includes a conductive pattern of which impedance varies due to damage or heat generation of a panel and senses the damage or heat generation of the panel by using the conductive pattern.

9 Claims, 9 Drawing Sheets

ORGANIC LIGHT EMITTING DISPLAY DEVICE

CROSS-REFERENCE TO RELATED APPLICATIONS

This application claims priority from Korean Patent Application No. 10-2015-0093378 filed on Jun. 30, 2015, which is hereby incorporated by reference for all purposes as if fully set forth herein.

BACKGROUND OF THE INVENTION

Field of the Invention

The present invention relates to an organic light emitting display device, and more particularly to an organic light emitting display device that senses abnormal operation.

Description of the Related Art

An organic light emitting element is an element emitting light by using electroluminescence phenomena that organic compounds disposed between electrodes emit light when current flows between two electrodes. An organic light emitting display device is a device displaying images by controlling the amount of current flowing in the organic compound to adjust the amount of light emission.

The organic light emitting display device has an advantage that a light and thin type can be made because light emits from thin organic compounds disposed between electrodes. According to this advantage, a recent organic light emitting display device has a tendency to have a much thinner type.

Thinning effect of such organic light emitting display device weakens strength of the organic light emitting display device. Incidentally, such weakness is a cause that makes the organic light emitting display device be easily damaged by external force.

On the other hand, the damaged organic light emitting display device contains not only a problem in appearance but also a risk factor potentially bringing about a fire.

The organic light emitting display device drives the organic light emitting element by using current so that, when the organic light emitting element is damaged, impedance of the organic light emitting element increases. At this point, when the organic light emitting display device does not sense the damage, the organic light emitting display device supplies the same current to the organic light emitting element regardless of increased impedance. Heat generation proportional to the power consumption increases proportionally to the impedance. Therefore, when the organic light emitting display device supplies the same current to the organic light emitting element having increased impedance, the heat generation of the organic light emitting element increases so that fire is brought about.

To reduce the riskiness of the fire, the damage of the organic light emitting display device has to be sensed.

SUMMARY

Accordingly, the present invention is directed to a an organic light emitting display device that substantially obviates one or more of the problems due to limitations and disadvantages of the related art.

An object of the present invention is to provide technology relating to an organic light emitting display device capable of sensing damage.

Another object of the present invention is to provide technology relating to an organic light emitting display device capable of sensing heat generation.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an organic light emitting display device comprises a substrate in which pixel areas are positioned; a sensing film which is elasticized by heat generated from the substrate and in which at least one conductive pattern having impedance is positioned; and a sensing portion which supplies a driving signal to the conductive pattern and receives a response signal corresponding to the driving signal to sense heat generated from the pixel areas.

As described herein, according to example embodiments of the present invention, it is possible to prevent damage of the organic light emitting display device by sensing damage or heat generation of the organic light emitting display device.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENT

Figure 1:
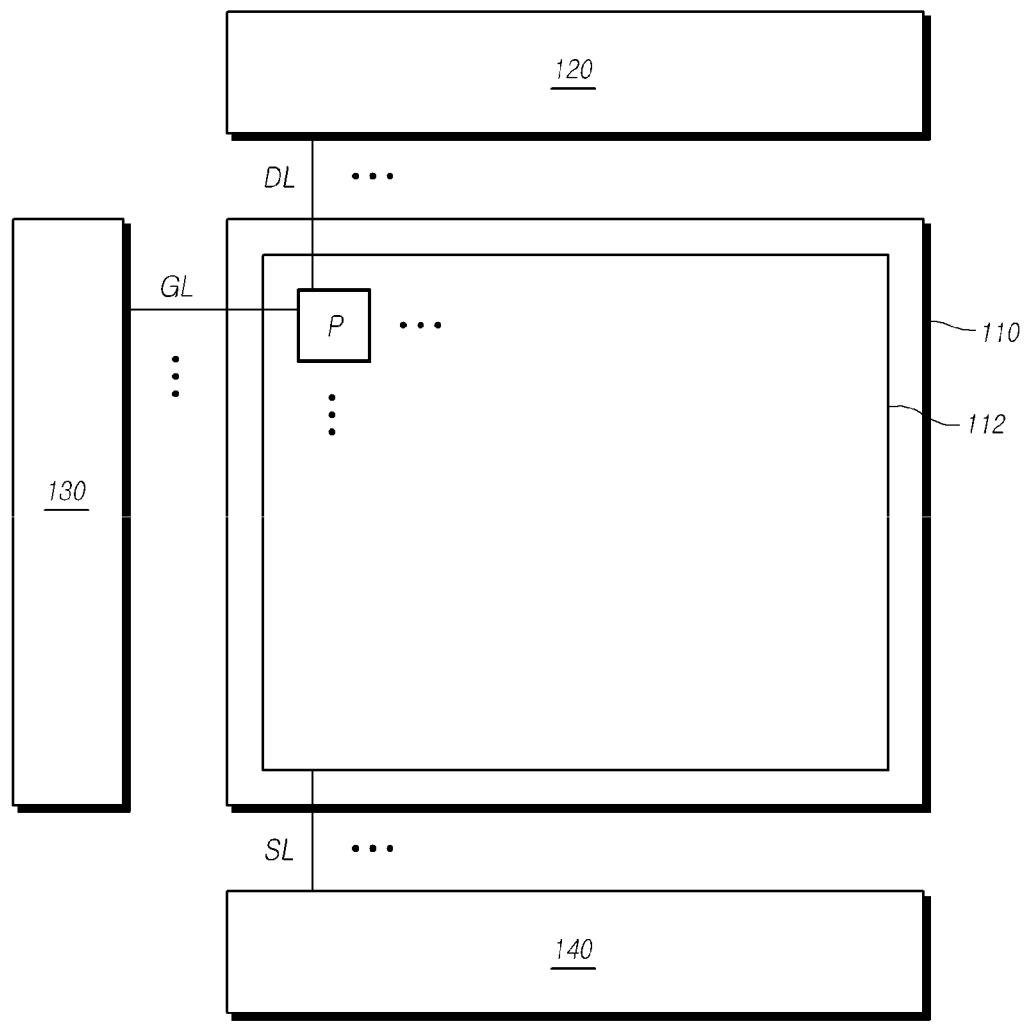
FIG. 1 is a drawing illustrating a schematic system configuration of an organic light emitting display device 100 according to an embodiment.

Hereinafter, some embodiments of the present invention will be described in detail with reference to the accompanying drawings. In describing the invention with reference to the accompanying drawings, like elements are referenced by like reference numerals or signs regardless of the drawing numbers. When it is determined that detailed description of known techniques involved in the invention makes the gist of the invention obscure, the detailed description thereof will not be made.

Terms such as first, second, A, B, (a), and (b) can be used to describe elements of the invention. These terms are merely used to distinguish one element from another element and the essence, order, sequence, number, or the like of the elements is not limited to the terms. If it is mentioned that an element is "coupled" or "connected" to another element, it should be understood that the element is directly coupled or connected to another element or still another element is "interposed" therebetween or the elements may be "coupled" or "connected" to each other with still another element interposed therebetween. Similarly, if it is mentioned that an element is "on" or "under" another element, it should be understood that the element is directly formed or indirectly formed at another element with still another element interposed therebetween.

FIG. 1 is a drawing illustrating a schematic system configuration of an organic light emitting display device 100 according to an embodiment.

Referring to FIG. 1, the organic light emitting display device 100 includes a panel 110, a data driving portion 120, a gate driving portion 130, a sensing portion 140, and the like.

In the panel 110, Data lines DL and gate lines GL are arranged, and pixels P are arranged at positions corresponding to points at which the data lines DL and the gate lines GL intersect.

Each pixel P of the panel 110 is at least one organic light emitting element including an anode, a cathode, and an organic light emitting layer. The organic light emitting layer included in each organic light emitting element includes at least one organic light emitting layer of organic light emitting layers for red, green, blue, and white, or a white organic light emitting layer.

In each pixel P, data line DL, gata line GL, and high potential voltage line (not shown) of supplying high potential voltage are connected. In each pixel P, a switching transistor is arranged between the data line DL and the gate line GL, and a driving transistor is arranged among an organic light emitting diode OLED, a source electrode (or drain electrode) of the switching transistor, and a high potential voltage line (not shown).

The switching transistor and the driving transistor are an oxide thin film transistor, and include an oxide layer formed of Indium Gallium Zinc Oxide (IGZO), Zinc Tin Oxide (ZTO), Zinc Indium Oxide (ZIO), and the like as a semiconductor layer, a gate electrode, source/drain electrodes, and the like.

The panel 110 includes a display panel and a touch screen panel (TSP). Herein, the display panel and the touch screen panel are separated from each other, or configured as an integrated panel sharing a portion thereof.

The data driving portion 120 supplies data voltage to the data lines DL to display a digital image on each pixel P of the panel 110.

Such data driving portion 120 includes at least one data driver integrated circuit. The data driver integrated circuit may be connected a bonding pad of the panel 110 in the Tape Automated Bonding (TAB) manner or a Chip On Glass (COG) manner, be directly formed on the panel 110, or be occasionally integrated to be arranged in the panel 110. The data driving portion 120 may be implemented in the Chip On Film (COF) manner.

The gate driving portion 130 sequentially supplies a scan signal to the gate line GL to turn-On or turn-Off a transistor positioned in each pixel P.

According to a driving method, such gate driving portion 130 is positioned at a side of the panel 110 as illustrated in FIG. 1 or is divided into two portions and positioned at both sided of the panel 110.

The gate driving portion 130 includes at least one gate driver integrated circuit. This at least one gate driver integrated circuit may be connected to a bonding pad of the panel 110 in the manner of the TAB manner or the COG manner, be directly formed on the panel 110 in the Gate In Panel (GIP) manner, or be occasionally integrated to be arranged in the panel 110. The gate driving portion 130 may be implemented in the COF manner.

The panel 110 includes a sensing film 112.

The sensing portion 140 supplies a driving signal to the sensing film 112 through a sensing line SL, and receives a response signal corresponding to the driving signal to sense heat generation of the panel 110.

Figure 2:
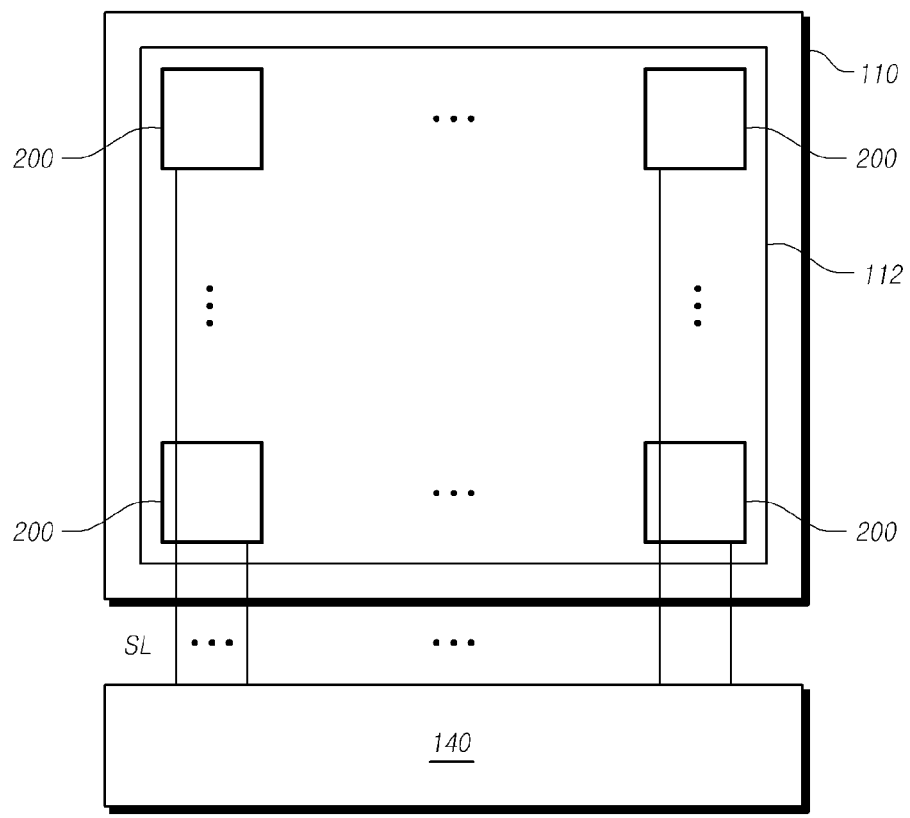
FIG. 2 is a drawing schematically illustrating a sensing film in which image sensors are arranged and a sensing portion which is connected to a sensor.

FIG. 2 is a drawing schematically illustrating a sensing film in which image sensors are arranged and a sensing portion which is connected to a sensor.

Sensors 200 are arranged in the sensing film 112.

Each sensor 200 has characteristics varying according to heat generation of the panel 110. For example, electrical characteristics of the sensor 200 vary according to the heat generation of the panel 110. In a more specific example, impedance such as resistance, capacitance, inductance of the sensor 200 varies according to the heat generation of the panel 110.

The sensor 200 is connected to the sensing portion 140 via the sensing line SL.

The sensing portion 140 senses characteristic variation of the sensor 200 with the sensing line SL. For example, when the impedance of the sensor 200 varies according to the heat generation of the panel 110, the sensing portion 140 senses the heat generation of the panel 110 by sensing the impedance of the sensor 200 from the sensing line SL.

The sensing portion 140 supplies a driving signal to the sensor 200, and receives a response signal corresponding to the driving signal to sense the heat generation of the panel 110.

As an example, the sensing portion 140 supplies a driving signal with an AC voltage type to the sensor 200, and receives a response signal with the AC voltage type corresponding to the driving signal. The sensing portion 140 calculates a phase difference and a voltage ratio of the driving signal and the response signal to sense the impedance of the sensor 200.

As another example, the sensing portion 140 supplies a driving signal with a DC voltage type to the sensor 200, and receives a response signal with the DC voltage type corresponding to the driving signal. The sensing portion 140 calculates a ratio of the driving signal and the response signal to sense the impedance (for example, resistance) of the sensor 200.

The sensor 200 includes at least one conductive pattern having impedance.

Figure 3:
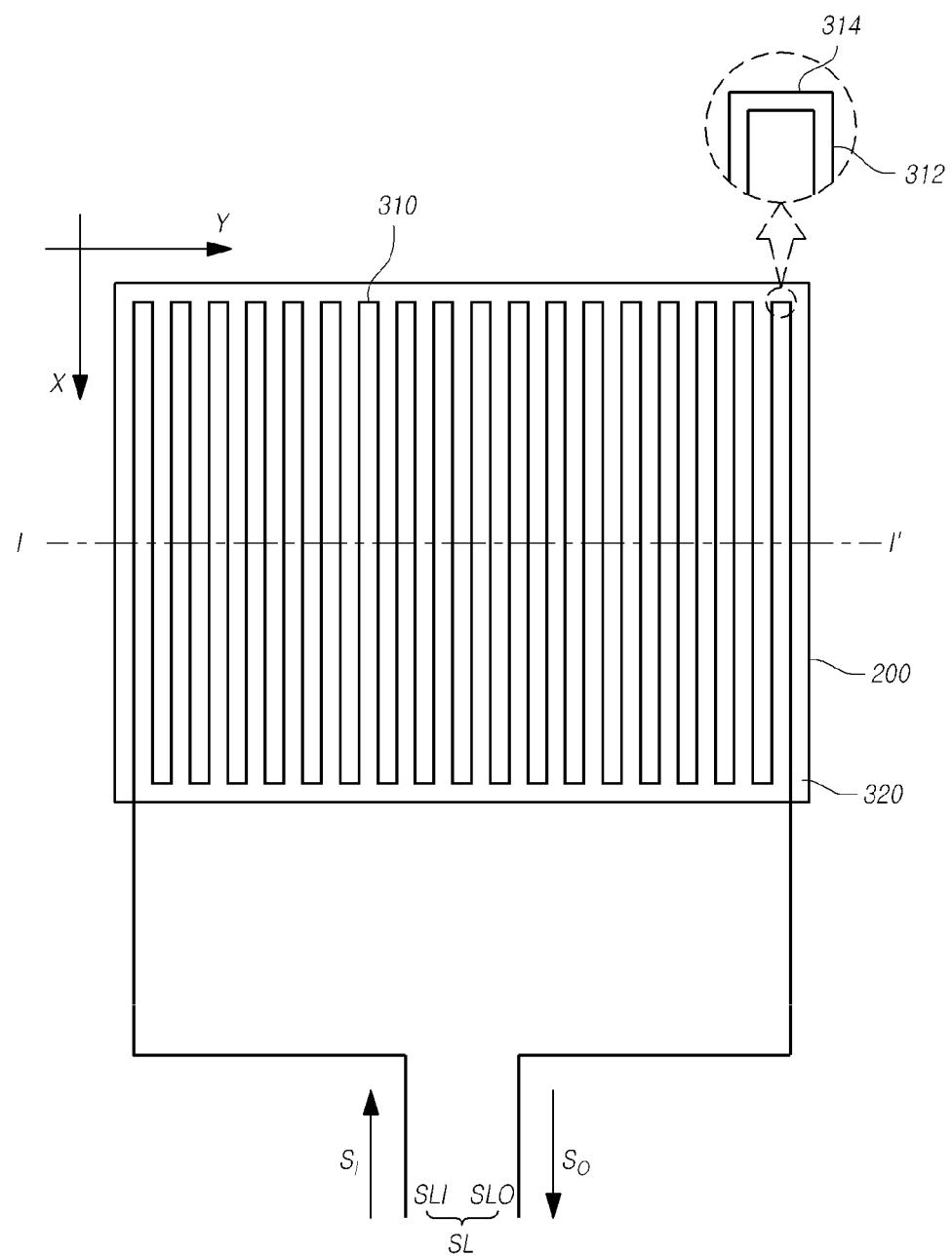
FIG. 3 is a first exemplary plan view of the sensor in which a conductive pattern is arranged.
Figure 4:
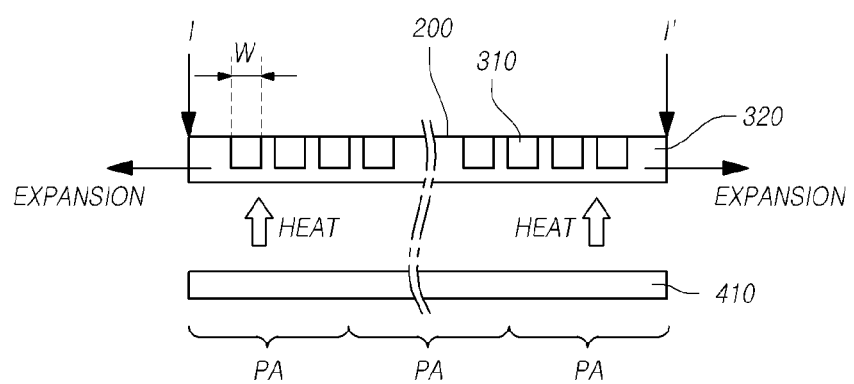
FIG. 4 is a drawing illustrating a cross-section taken along the line I-I' of FIG. 3 and a section of a substrate positioned below the cross-section.

FIG. 3 is a first exemplary plan view of the sensor in which a conductive pattern is arranged, and FIG. 4 is a drawing illustrating a cross-section taken along the line I-I' of FIG. 3 and a section of a substrate positioned below the cross-section.

Referring to FIG. 3, the sensor 200 includes a conductive pattern 310 and a film layer 320 in which the conductive pattern 310 is arranged.

The conductive pattern 310 is configured as a single line. But, the single line is an example, and the conductive pattern may be configured as two or more lines.

The conductive pattern 310 includes a first pattern lines 312 arranged in a first direction X, and a second pattern lines 314 arranged in a second direction Y. In this example, the first direction X is perpendicular to the second direction Y. Two lines of the first pattern lines 312 are connected to each other via the second pattern lines 314, and two lines of the second pattern lines 314 are connected to each other via the first pattern lines 312.

The sensing line SL includes an input sensing line SLI and an output sensing line SLO, and a side end of the conductive pattern 310 is connected to the input sensing line SLI and the other side end thereof is connected to the output sensing line SLO. A driving signal SI is supplied to the input sensing line SLI and a response signal SO is received from the output sensing line SLO.

The conductive pattern 310 is a pattern having impedance, the impedance varying according to expansion and contraction of the sensor 200 or heat applied from the outside. According to an example, the conductive pattern 310 is attached to the film layer 320 so that the impedance varies depending on shape variation of the pattern line due to expansion and contraction of the film layer 320.

An example of the sensor 200 which expands or contracts according to the heat of the outside is illustrated in FIG. 4.

Referring to FIG. 4, heat generated from pixel areas PA positioned in a substrate 410 is transferred to the sensor 200 closely positioned to the substrate 410.

The heat generated from the pixel areas PA of the substrate directly changes the impedance of the conductive pattern 310. The conductive pattern is formed of metallic material, and the metallic material has a characteristic that resistivity varies according to temperature. As a result, the impedance of the conductive pattern 310 varies according to the heat generated from the pixel areas PA.

The heat generated from the pixel areas PA of the substrate 410 causes expansion of the sensor 200 so that the conductive pattern 310 varies depending to the expansion and thus the impedance varies. For example, the more the impedance increases the longer the conductive pattern 310 becomes, and the more the impedance increases the narrower a cross-section of the pattern line becomes. As a result, the length of the conductive pattern 310 or a cross-section area of the pattern line varies according to expansion and contraction of the sensor 200, and thus the impedance of the conductive pattern 310 varies.

The conductive pattern 310 expands according to the heat generated from the pixel areas PA of the substrate 410 in itself, and the conductive pattern 310 expands according to the expansion of the film layer 320 attached thereto.

In a specific example, the conductive pattern 310 of the sensor 200 is attached to the film layer 320, so that the conductive pattern 310 concomitantly expands or contracts according to expansion or contraction of the film layer 320.

The film layer 320 is made of resin, and thus length, area, or volume thereof expands or contracts due to the heat applied from the outside. Acryl, urethane acryl, acrylic ester, epoxy, polyethylene synthetic resin, or the like is applied as the resin comprising the film layer 320. Meanwhile, copper, aluminum, carbon, or Indium Tin Oxide (ITO) is applied as conductive material of the conductive pattern 310.

The conductive pattern 310 attached to the film layer 320 expands or contracts according to the expansion or contraction of the film layer 320, so that the impedance of the conductive pattern 310 varies according to the heat generated from the pixel areas PA of the substrate 410.

A direction of expansion and contraction varies according to distribution of heat and characteristics of the sensor 200 or the film layer 320. As illustrated in FIG. 3, when the conductive pattern 320 includes pattern lines arranged in two directions (X and Y directions) perpendicular to each other, heat generation can be sensed regardless of the direction of expansion and contraction.

Impedance variation is sensed according to relationships between the driving signal SI and the response signal SO. For example, when the driving signal SI is DC voltage and the response signal SO is DC current, the impedance of the conductive pattern 310 is determined according to a value obtained by dividing the dimensions of the driving signal SI by the dimensions of the response signal SO.

When deformation of the conductive pattern 310 is widely caused, disconnection or short circuit may occur in the conductive pattern 310. When the disconnection occurs in the conductive pattern 310, the impedance of the conductive pattern 310 is sensed to be higher than normal impedance, and when the short circuit occurs in the conductive pattern 310, the impedance of the conductive pattern 310 is sensed to be lower than the normal impedance.

When coefficients of thermal expansion of the film layer 320 and the conductive pattern 310 are different from each other, the deformation of the conductive pattern 310 widely occurs.

As described above, the conductive pattern 310 is attached to the film layer 320, so that the conductive pattern 310 concomitantly expands or contracts according to expansion or contraction of the film layer 320. Here, coefficients of thermal expansion of the film layer 320 and the conductive pattern 310 may be different from each other. That is, when the film layer 320 has a first coefficient of thermal expansion and the conductive pattern 310 has a second coefficient of thermal expansion, the first and second coefficients of thermal expansion may be different from each other. In a case where this example is applied, the film layer 320 and the conductive pattern 310 expand or contract differently from each other, so that the disconnection or the short circuit is caused in the conductive pattern 310 in itself.

Referring to FIG. 4, the sensor 200 or the conductive pattern 310 is positioned to correspond to two or more pixel areas PA. The conductive pattern 310 is positioned to correspond to N pixel areas PA, wherein the N is a natural number. The sensing film (referred to as 112 of FIG. 2) includes a plurality of the conductive pattern 310. According to an example having this configuration, impedance of the only conductive pattern 310 positioned to correspond to a pixel area PA in which heat generation is higher than a critical value exceeds a reference value, so that the sensing portion (referred to as 140 of FIG. 2) more exactly identifies a position in which the heat is generated.

The width W of the cross-section of the pattern line included in the conductive pattern 310 is less than widths of the data line (referred to as DL of FIG. 1) and the gate line (referred to as GL of FIG. 1) arranged in the pixel area PA. The width W of the cross-section of the pattern line included in the conductive pattern 310 is less than width of the other line (for example, a line connecting the gate line to the switching transistor, a line connecting the data line to the driving transistor, and the like) arranged in the pixel area PA.

Even when the heat is not generated from the pixel area PA, elements (for example, the gate line, the data line, and the like) positioned in the pixel area PA are damaged due to external impact. As described above, the width W of the cross-section of the pattern line included in the conductive pattern 310 is less than widths of the cross-sections of the elements positioned in the pixel area PA. In this example, the conductive pattern 310 has also a high possibility of being damaged with the elements positioned in the pixel area PA, so that damage of the pixel area PA is also identified by sensing the conductive pattern 310 of the sensing portion (referred to as 140 of FIG. 2).

The conductive pattern includes two or more sub-patterns which are not connected to each other.

Figure 5:
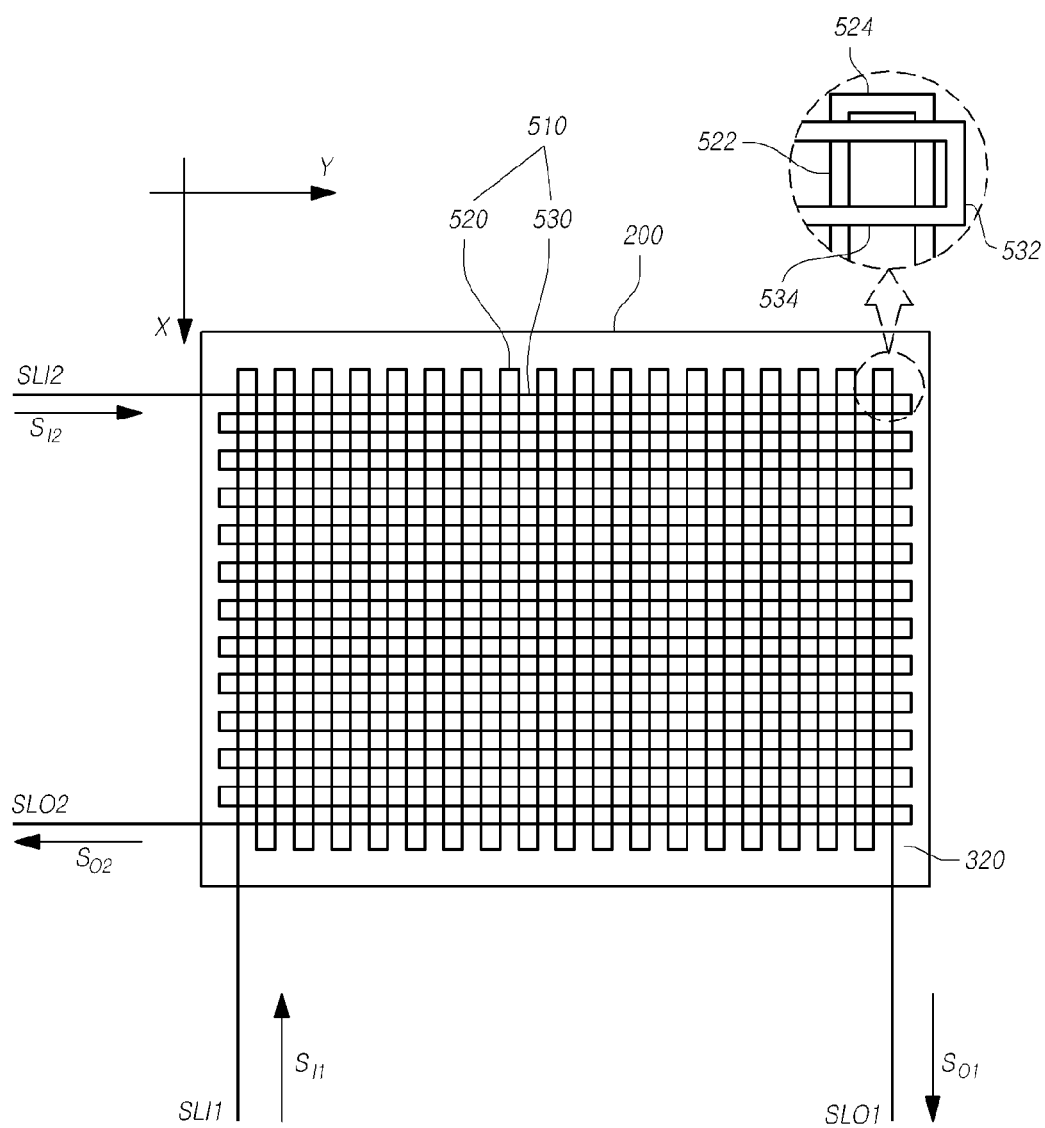
FIG. 5 is a second exemplary plan view of the sensor in which a conductive pattern is arranged.

FIG. 5 is a second exemplary plan view of the sensor in which a conductive pattern is arranged.

Referring to FIG. 5, a conductive pattern 510 is comprised of a first sub-pattern 520 and a second sub-pattern 530.

The first sub-pattern 520 includes first pattern lines 522 arranged in a first direction X and second pattern lines 524 arranged in a second direction Y. In this example, the first direction X is perpendicular to the second direction Y. Two of the first pattern lines 522 are connected to each other via one of the second pattern lines 524, and two of the second pattern liens 524 are connected to each other via one of the first pattern lines 522.

The second sub-pattern 530 includes third pattern lines 532 arranged in the first direction X and fourth pattern lines 534 arranged in the second direction Y. Two of the third pattern lines 532 are connected to each other via one of the fourth pattern lines 534, and two of the fourth pattern liens 534 are connected to each other via one of the first pattern lines 532.

In the first sub-pattern 520, the length of the first line 522 arranged in the first direction X is longer than the length of the second line 524 arranged in the second direction Y, and in the second sub-pattern 530, the length of the fourth line 534 arranged in the second direction Y is longer than the length of the third line 532 arranged in the first direction X. In a case to which this example is applied, the first sub-pattern 520 more sensitively reacts to damage of the panel 110 which occurs in the first direction X or the second direction Y, and the second sub-pattern 530 more sensitively reacts to damage of the panel 110 which occurs in the second direction Y or the first direction Y. As a result, the sensing portion of sensing heat generation (referred to as 140 of FIG. 1) senses the damage of the panel 110 regardless of the direction.

In the example illustrated in FIG. 5, the sensing line (referred to as SL of FIG. 2) is comprised of a first input sensing line SLT1, a first output sensing line SLO1, a second input sensing line SLI2, and a second output sensing line SLO2.

The first input sensing line SLT1 is connected to a side end of the first sub-pattern 520 and the first output sensing line SLO1 is connected to the other side end of the first sub-pattern 520. A first driving signal ST1 is supplied to the first input sensing line SLI1 and a first response signal SO1 is received from the first output sensing line SLO1.

The second input sensing line SLT2 is connected to a side end of the second sub-pattern 530 and the second output sensing line SLO2 is connected to the other side end of the first sub-pattern 530. A second driving signal ST2 is supplied to the second input sensing line SLI2 and a second response signal SO2 is received from the second output sensing line SLO2.

The first driving signal ST1 and the second driving signal ST2 are substantially the same signal. For example, the first driving signal ST1 and the second driving signal ST2 are substantially the same DC voltage. Here, when the first response signal SO1 is different from the second response signal SO2, the sensing portion of sensing the heat generation (referred to as 140 of FIG. 1) senses damage generated in a direction.

The first driving signal ST1 and the second driving signal ST2 are different from each other. For example, the first driving signal ST1 and the second driving signal ST2 are AC voltage having a frequency different from each other. Here, the sensing portion of sensing the heat generation (referred to as 140 of FIG. 1) senses damage of the panel 110 by comparing two response signal SO1 and SO2 to the two different frequencies.

The sensing film 112 includes further a polarizing plate that polarizes light emitted from the panel 110. In the example, the sensing film 112 functions as a polarizing film together. In another aspect, the polarizing film functions as the sensing film 112 together.

Figure 6:
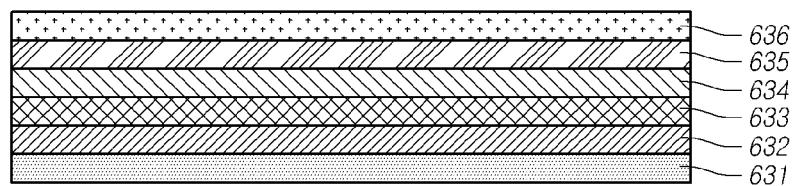
FIG. 6 is a drawing schematically illustrating a cross-section of a sensing film including a polarizing plate.

FIG. 6 is a drawing schematically illustrating a cross-section of a sensing film including a polarizing plate.

Referring to FIG. 6, the sensing film 112 includes a first protective layer 631, a pattern layer 632, an insulating layer 633, a second pattern 634, a polarizing plate 635, and a second protective layer 636.

The first protective layer 631 and the second protective layer 636 is made of triacetyl cellulose (TAC).

The polarizing plate 635 is formed by orienting iodine on a base film including poly vinyl alcohol (PVA).

The first sub-pattern (referred to as 520 of FIG. 5) described with reference to FIG. 5 is positioned on the first pattern layer 632, and the second sub-pattern (referred to as 530 of FIG. 5) is positioned on the second pattern layer 634.

The sensing film 112 includes only the first pattern layer 632 without the second pattern layer 634, and a conductive pattern positioned in the first pattern layer 632 includes pattern lines arranged in parallel with the direction of orientation of the polarizing plate 635. The conductive pattern 310 described with reference to FIG. 3 is positioned in the polarizing plate 635, and in this example, the first direction X is parallel with the direction of orientation of the polarizing plate 635. The length of the first pattern lines 312 arranged in parallel with the direction of orientation of the polarizing plate 635 is longer than the length of the second pattern lines 314 arranged in a direction perpendicular to the direction of orientation of the polarizing plate 635.

The conductive pattern is positioned in a non-luminescent area of the pixel area.

Figure 7:
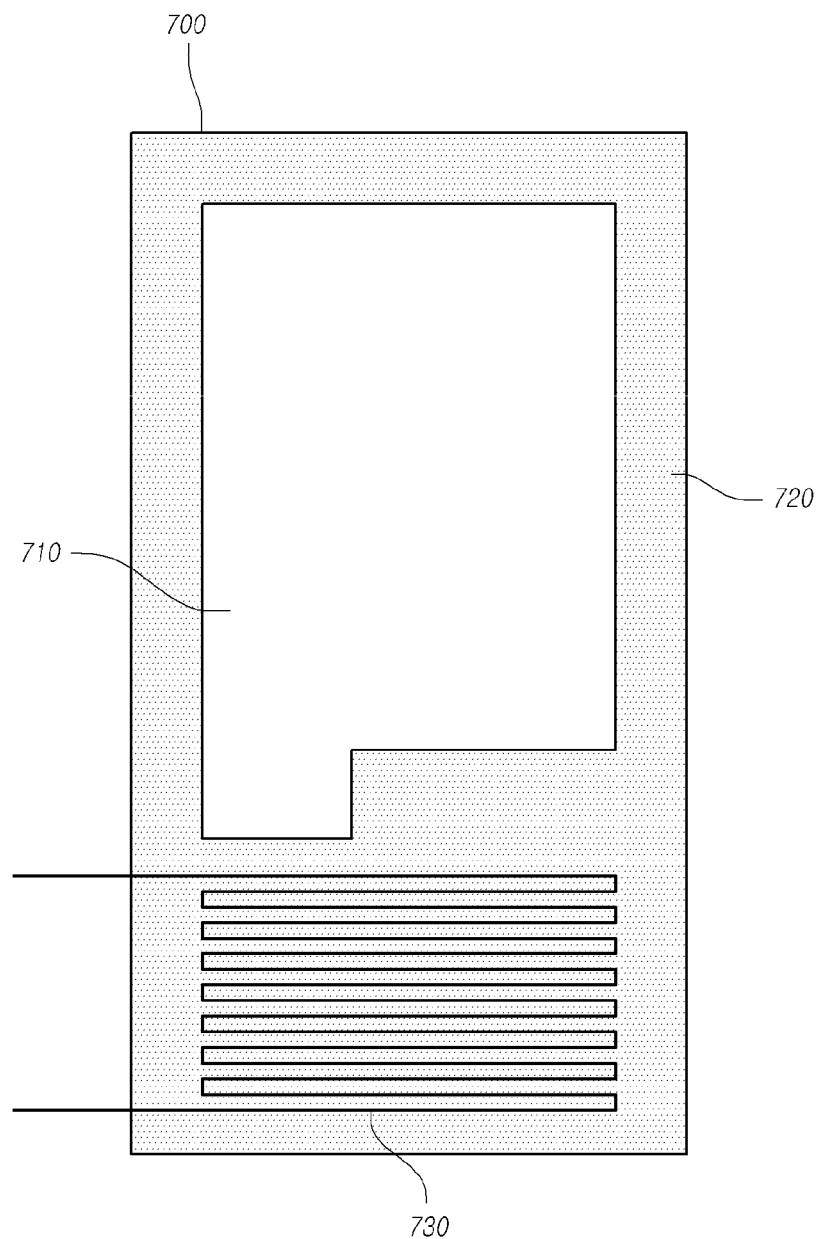
FIG. 7 is a drawing schematically illustrating a pixel area and a conductive pattern positioned in a non-luminescent area of the pixel area.

FIG. 7 is a drawing schematically illustrating a pixel area and a conductive pattern positioned in a non-luminescent area of the pixel area.

Referring to FIG. 7, a pixel area 700 corresponding to the pixel (referred to as P of FIG. 1) includes a luminescent area 710 and a non-luminescent area 720.

The luminescent area 710 is an area in which an organic light emitting diode (OLED) is positioned and light emits according to electroluminescence phenomena. The non-luminescent area 720 is an area in which peripheral elements of the OLED such as a gate line (referred to as GL of FIG. 1), a data line (referred to as DL of FIG. 1), a switching transistor, a driving transistor are positioned.

A conductive pattern 730 is positioned in the non-luminescent area 720. According to this example, light emitting from the luminescent area 710 is not blocked by the conductive pattern 730.

The panel (referred to as 110 of FIG. 1) includes a display panel and a touch screen panel, and the sensing film (referred to as 112 of FIG. 1) is positioned in the touch screen panel.

Figure 8:
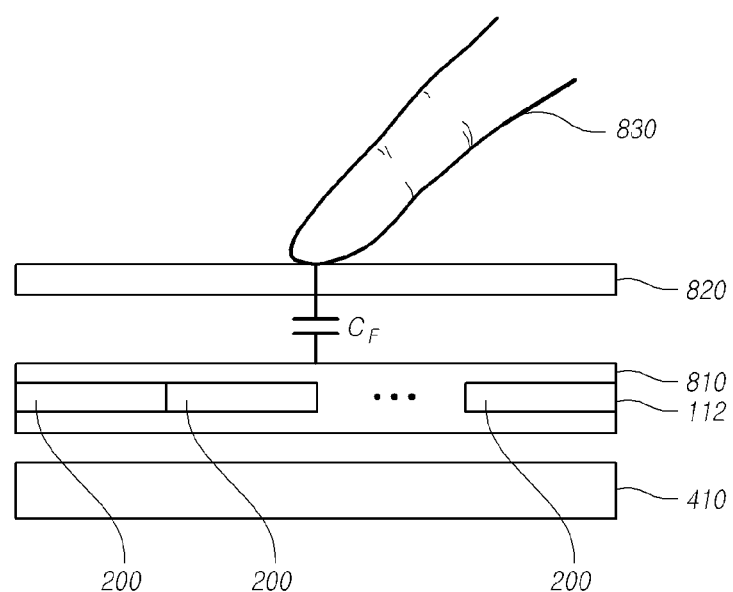
FIG. 8 is a drawing illustrating an example in which a sensing file is positioned in a touch screen panel.

FIG. 8 is a drawing illustrating an example in which a sensing file is positioned in a touch screen panel.

Referring to FIG. 8, a touch screen panel 810 is positioned on the substrate 410, and a glass plate 820 is positioned on the touch screen panel 810. The sensing film 112 is positioned in the touch screen panel 810.

The touch screen panel includes a touch sensor in which capacitance varies according to proximity or touch of an external object 830, the sensor 112 positioned in the sensing film 112 functions as the touch sensor. Therefore, a touch driving signal for sensing the touch as well as a driving signal for sensing heat generation or damage in the pixel area is supplied to the sensor 112.

Figure 9:
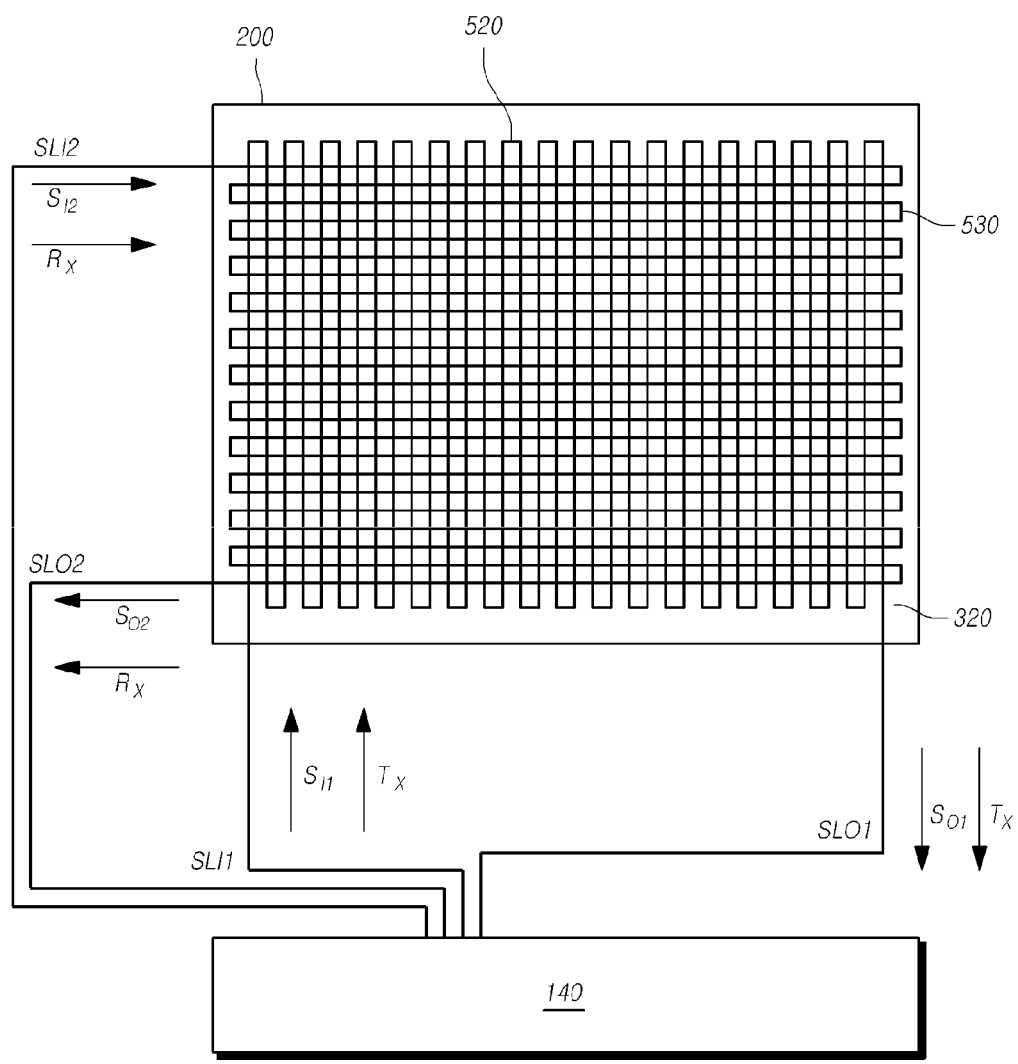
FIG. 9 is a drawing illustrating flow of a signal supplied to the sensor of FIG. 8.

FIG. 9 is a drawing illustrating flow of a signal supplied to the sensor of FIG. 8.

Referring to FIG. 9, the sensor 200 includes the first sub-pattern 520 and the second sub-pattern 530.

The first sub-pattern 520 is electrically isolated from the second sub-pattern 530, and capacitance is formed between the first sub-pattern 520 and the second sub-pattern 530. The sensing portion 140 senses the capacitance formed between the first sub-pattern 520 and the second sub-pattern 530 to sense the proximity or the touch of the external object (referred to as 830 of FIG. 8).

The first input sensing line SLI1 and the first output sensing line SLO1 are connected to the first sub-pattern 520, and a second input sensing line SLI2 and the second output sensing line SLO2 are connected to the second sub-pattern 530.

The sensing portion 140 supplies a driving signal for sensing heat generation or damage and a touch driving signal for sensing touch to the sensor 200 in a time interval.

The sensing portion 140 supplies driving signals ST1 and ST2 for sensing the heat generation or the damage to the first input sensing line SLT1 and the second input sensing line SLT2 to the first sub-pattern 520 and the second sub-pattern 530 in a first time. The sensing portion 140 receives response signals SO1 and SO2 corresponding to the driving signals ST1 and ST2 from the first output sensing line SLO1 and the second output sensing line SLO2. The sensing portion 140 senses the heat generation or the damage by analyzing the response signals SO1 and SO2.

The sensing portion 140 supplies a touch driving signal Tx to the sensor 200 in a second time, and receives a touch response signal Rx corresponding to the touch driving signal Tx to sense the proximity or the touch of the external object (referred to as 830 of FIG. 8).

The sensing portion 140 supplies the touch driving signal Tx to the first input sensing line SLT1 or the first output sensing line SLO1 in the second time, and receives the touch response signal Rx from the second input sensing line SLI1 or the second output sensing line SLO2 to sense the proximity or the touch of the external object (referred to as 830 of FIG. 8).

The example in which the conductive pattern is positioned in the sensing film 112 is described above, but the present invention is not limited to the example. The conductive pattern is positioned on the other area in which the sensing film is not arranged. For example, the conductive pattern is deposited on a glass plate to which the panel 110 is attached. According to the example, the impedance of the conductive pattern varies widely depending on damage such as a crack of the glass plate, so that the organic light emitting display device 100 easily senses the damage.

As described above, according to the present invention, damage or heat generation of the organic light emitting display device 100 is easily sensed so that the damage of the organic light emitting display device 100 can be prevented.

Further, the terms, such as "include", "constitute", or "have" described herein means that corresponding component is inherent so long as there is no special description of opposite meaning, and thus should be construed as not excluding another component but further including another component. All terms including technical terms and scientific terms should be understood to have the same meaning as what is generally construed by those skilled in the art so long as it is differently defined. General term such as terms defined in a dictionary should be construed to be equal to the meaning of a context of the related art, and should not construed as ideal or excessive formal meaning so long as it is not clearly defined in the present invention.

It will be apparent to those skilled in the art that various modifications and variations can be made in the organic light emitting display device of the present invention without departing from the spirit or scope of the invention. Thus, it is intended that the present invention cover the modifications and variations of this invention provided they come within the scope of the appended claims and their equivalents.

What is claimed is:

1. An organic light emitting display device, comprising:
   a substrate in which pixel areas are positioned;
   a sensing film including a film layer disposed on a substrate and elasticized by heat generated from the substrate, and at least one conductive pattern disposed in the film layer and having impedance; and
   a sensing portion which is connected to the conductive pattern and supplies a driving sign al to the conductive pattern and receives a response signal corresponding to the driving signal to sense heat generated from the pixel areas,
   wherein the response signal is varied in response to a temperature change due to a difference in thermal expansion degree between the film layer and the conductive pattern having different thermal expansion coefficients.

2. The organic light emitting display device according to claim 1, wherein the conductive pattern is positioned to correspond to two or more pixel areas.

3. The organic light emitting display device according to claim 1, wherein the film layer has a first coefficient of thermal expansion, and the conductive pattern has a second coefficient of thermal expansion less than the first coefficient of thermal expansion.

4. The organic light emitting display device according to claim 1, wherein the sensing film includes a first pattern layer, a second pattern layer, and an insulating layer positioned between the first pattern layer and the second pattern layer,
   the conductive pattern comprises a first sub-pattern and a second sub-pattern, and
   the first sub-pattern is positioned on the first pattern layer and the second sub-pattern is positioned on the second pattern layer.

5. The organic light emitting display device according to claim 4, wherein the first sub-pattern includes a first pattern lines arranged in a first direction, and
   the second sub-pattern includes second pattern lines arranged in a second direction perpendicular to the first direction.

6. The organic light emitting display device according to claim 1, wherein the sensing film further includes a polarizing plate which polarizes light emitting from a display panel.

7. The organic light emitting display device according to claim 6, wherein the conductive pattern includes pattern lines arranged in parallel with an alignment direction of the polarizing plate.

8. The organic light emitting display device according to claim 1, wherein the pixel area includes a luminescent area and a non-luminescent area, and the conductive pattern is positioned to correspond to the non-luminescent area of the pixel area.

9. The organic light emitting display device according to claim 1, wherein the sensing portion supplies a touch driving signal to the conductive pattern, and receives a touch response signal corresponding to the touch driving signal to sense proximity or touch of an external object.

* * * * *